(12) United States Patent
Kim et al.

(10) Patent No.: US 10,056,527 B2
(45) Date of Patent: Aug. 21, 2018

(54) UV LED PACKAGE

(71) Applicant: LUMENS CO., LTD., Yongin-si, Gyeonggi-do (KR)

(72) Inventors: MinPyo Kim, Yongin-si (KR); DaeWon Kim, Yongin-si (KR)

(73) Assignee: LUMENS CO., LTD., Yongin-si (KR)

(*) Notice: Subject to any disclaimer, the term of this patent is extended or adjusted under 35 U.S.C. 154(b) by 0 days.

(21) Appl. No.: 15/654,478

(22) Filed: Jul. 19, 2017

(65) Prior Publication Data

US 2018/0063902 A1   Mar. 1, 2018

(30) Foreign Application Priority Data

Sep. 1, 2016   (KR) .......................... 10-2016-0112768

(51) Int. Cl.
*H01L 33/38*   (2010.01)
*H05B 33/08*   (2006.01)
(Continued)

(52) U.S. Cl.
CPC .............. *H01L 33/38* (2013.01); *F21K 9/237* (2016.08); *G02B 6/102* (2013.01); *H01L 23/12* (2013.01);
(Continued)

(58) Field of Classification Search
CPC ......... H01L 33/20; H01L 33/42; H01L 33/48; H01L 33/486; H01L 33/505; H01L 33/60;
(Continued)

(56) References Cited

U.S. PATENT DOCUMENTS

| | | | | |
|---|---|---|---|---|
| 8,129,743 B2* | 3/2012 | Suehiro | .................. | H01L 33/486 257/100 |
| 2009/0179207 A1* | 7/2009 | Chitnis | .................. | H01L 33/44 257/88 |

(Continued)

FOREIGN PATENT DOCUMENTS

KR    1020120041717    5/2012
KR    1013497010000    1/2014
(Continued)

*Primary Examiner* — Eduardo A Rodela
(74) *Attorney, Agent, or Firm* — Mei & Mark LLP (57) ABSTRACT

A UV LED package disclosed herein includes a submount, a UV LED chip adapted to emit UV light at 200 nm to 400 nm, and a package body mounted with the submount. The submount includes a heat dissipating substrate, a first reflective electrode film and a second reflective electrode film separated from each other by an electrode separation gap on the heat dissipating substrate, a first flip-chip bonding pad and a first wire bonding pad disposed on the first reflective electrode film, and a second flip-chip bonding pad and a second wire bonding pad disposed on the second reflective electrode film. The UV LED chip includes a first conductive electrode pad corresponding to the first flip-chip bonding pad and a second conductive electrode pad corresponding to the second flip-chip bonding pad. The UV LED chip is flip-chip bonded to the submount through a first bonding bump interposed between the first flip-chip bonding pad and the first conductive electrode pad and a second bonding bump interposed between the second flip-chip bonding pad and the second conductive electrode pad. The package body includes a first metal body electrically connected to the first wire bonding pad through a first bonding wire and a second metal body separated from the first metal body by an insulating material and electrically connected to the second wire bonding pad through a second bonding wire.

18 Claims, 6 Drawing Sheets

(51) Int. Cl.
  *H01L 25/075* (2006.01)
  *H01L 33/34* (2010.01)
  *H01L 33/48* (2010.01)
  *F21K 9/237* (2016.01)
  *G02B 6/10* (2006.01)
  *H01L 23/485* (2006.01)
  *H01L 23/12* (2006.01)
  *H01L 23/13* (2006.01)
  *H01L 33/36* (2010.01)
  *H01L 23/482* (2006.01)

(52) U.S. Cl.
  CPC ............ *H01L 23/13* (2013.01); *H01L 23/485* (2013.01); *H01L 23/4824* (2013.01); *H01L 25/0753* (2013.01); *H01L 33/34* (2013.01); *H01L 33/36* (2013.01); *H01L 33/387* (2013.01); *H01L 33/483* (2013.01); *H01L 33/486* (2013.01); *H05B 33/08* (2013.01)

(58) Field of Classification Search
  CPC ......... H01L 23/12; H01L 23/13; H01L 23/14; H01L 23/142; H01L 23/147; H01L 23/48; H01L 23/4824; H01L 23/485; H01L 33/36; H01L 33/38; H01L 33/387
  See application file for complete search history.

(56) References Cited

U.S. PATENT DOCUMENTS

| | | | |
|---|---|---|---|
| 2010/0140640 A1* | 6/2010 | Shimokawa | H01L 33/0079 257/98 |
| 2010/0320488 A1* | 12/2010 | Horie | H01L 27/153 257/91 |
| 2015/0070909 A1* | 3/2015 | Jung | F21V 3/10 362/362 |
| 2015/0228839 A1* | 8/2015 | Park | H01L 31/1013 257/82 |

FOREIGN PATENT DOCUMENTS

| | | |
|---|---|---|
| KR | 1020140090805 | 7/2014 |
| KR | 1020150029920 | 3/2015 |
| KR | 1020160094213 | 8/2016 |

* cited by examiner

UV LED PACKAGE

CROSS-REFERENCE TO RELATED APPLICATION(S)

The present application relates to and claims priority to Korean Patent Application No. 10-2016-0112768, filed on Sep. 1, 2016, the entire content of which is incorporated herein by reference in its entirety.

FIELD

The present invention relates to a ultra-violet (UV) light emitting diode (LED) package including a UV LED chip, and more specifically to a UV LED package with greatly improved heat dissipation performance, durability, and efficiency including a structure adapted to characteristics of the UV LED chip.

BACKGROUND

UV LED packages include UV LED chips emitting UV light at wavelengths of 200 nm to 400 nm and are used in various applications, such as sterilizers. Such UV LED chips emit UV light at much shorter wavelengths than a blue wavelength region. Due to a strong energy of UV light, a large amount of heat is released from the UV LED chips.

A typical conventional UV LED package uses a flip-chip UV LED chip. The conventional UV LED package includes a package body including two lead electrodes separated from each other by an electrode separation line. The UV LED chip includes two downwardly pointing bonding pads that are mounted on the package body by direct flip-chip bonding to corresponding lead electrodes. The UV LED chip is flip-chip bonded only in a limited direction. Specifically, first and second flip-chip bonding pads or first and second bonding bumps of the UV LED chip are arranged orthogonal to the electrode separation line.

The conventional UV LED package is difficult to design for abnormal overheating so long as the UV LED chip is not large in an area. Despite this difficulty, the UV LED chip is usually limited to a small area, and as a result, heat from the bonding pads of the UV LED chip is not efficiently delivered to the lead electrodes of the package body, resulting in a poor heat dissipation efficiency. Thus, the lifetime of the conventional UV LED package is shortened by heat generated when the UV LED chip emits UV light at short wavelengths of 200 to 400 nm, particularly 270 to 285 nm.

Another problem of the UV LED package is that due to a narrow width of the electrode separation line (that is, the small distance between the lead electrodes), bonding materials (i.e., soldering materials) may remain unseparated and adhere to each other during flip-chip bonding of the UV LED chip, increasing the risk of short-circuiting. Also, see a related art disclosed in a Korean Patent Application No. 10-1349701, filed Jan. 3, 2014.

A large portion of the package body of the UV LED package other than the lead electrodes is made of a resin. This increases the risk that UV light may cause the package body to crack or discolor. Hence, there is a need for an improved UV LED package addressing at least these shortcomings.

SUMMARY

The present disclosure provides a UV LED package having a structure optimized for UV light emitted from a UV LED chip and adapted to characteristics of the UV LED chip such that heat dissipation performance, durability, and efficiency are prevented from deterioration resulting from heat generated when the UV LED chip emits UV light.

One aspect of the present invention provides a UV LED package including: a submount including a heat dissipating substrate, a first reflective electrode film and a second reflective electrode film separated from each other by an electrode separation gap on the heat dissipating substrate, a first flip-chip bonding pad and a first wire bonding pad disposed on the first reflective electrode film, and a second flip-chip bonding pad and a second wire bonding pad disposed on the second reflective electrode film; a UV LED chip adapted to emit UV light at 200 nm to 400 nm, including a first conductive electrode pad corresponding to the first flip-chip bonding pad and a second conductive electrode pad corresponding to the second flip-chip bonding pad, and flip-chip bonded to the submount through a first bonding bump interposed between the first flip-chip bonding pad and the first conductive electrode pad and a second bonding bump interposed between the second flip-chip bonding pad and the second conductive electrode pad; and a package body mounted with the submount and including a first metal body electrically connected to the first wire bonding pad through a first bonding wire and a second metal body separated from the first metal body by an insulating material and electrically connected to the second wire bonding pad through a second bonding wire.

According to one embodiment, the first metal body and the second metal body have a first depression and a second depression formed by a reduction in thickness at positions facing each other through the insulating material, respectively, and the first depression is merged with the second depression to form a cavity in which the UV LED chip and the submount are accommodated.

According to one embodiment, the first metal body and the second metal body are made of an Al material.

According to one embodiment, the UV LED package further includes a UV transmissive protective member made of quartz that is coupled to the top portion of the package body to protect the UV LED chip.

According to one embodiment, the heat dissipating substrate includes a conductive Si wafer and a $SiO_2$ layer formed on the Si wafer by oxidizing the Si wafer.

According to one embodiment, the first reflective electrode film and the second reflective electrode film are formed by depositing Al or Au on the heat dissipating substrate.

According to one embodiment, the first flip-chip bonding pad and the first wire bonding padare formed on the first reflective electrode film and the second flip-chip bonding pad and the second wire bonding pad are formed on the second reflective electrode film by the same process using the same material including Au or AuSn.

According to one embodiment, the submount is mounted only on the first metal body.

According to one embodiment, the first metal body has a larger area than the second metal body.

According to one embodiment, the electrode separation gap is in the shape of a circular arc, a curve or a combination of two or more straight or curved lines crossing each other such that the first reflective electrode film surrounds a portion of the second reflective electrode film.

According to one embodiment, the submount is in the form of a large quadrangle with four corners, the second reflective electrode film has a small quadrangular second area that occupies one of the four corners of the submount, and the first reflective electrode film has a first area that surrounds two sides of the second area while occupying the three remaining corners.

According to one embodiment, the second flip-chip bonding pad is disposed adjacent to one corner of the second reflective electrode film located in the central area of the submount and the first flip-chip bonding pad is arranged adjacent to a recessed corner of the first reflective electrode film diagonally facing the second flip-chip bonding pad.

According to one embodiment, the first flip-chip bonding pad includes a main bonding pattern diagonally facing the second flip-chip bonding pad and a pair of peripheral bonding patterns arranged away from the direction diagonal to the second flip-chip bonding pad around the main bonding pattern.

According to one embodiment, the main bonding pattern is connected to the pair of peripheral bonding patterns through a pair of linear connection bonding patterns crossing each other around the main bonding pattern.

According to one embodiment, the electrode separation gap is formed in a "⌐" shape, the first flip-chip bonding pad is disposed in a "⌐" shape on the first reflective electrode film outside the ⌐-shaped electrode separation gap, and the second flip-chip bonding pad is disposed in a circular shape on the second reflective electrode film inside the ⌐-shaped electrode separation gap.

According to one embodiment, the first flip-chip bonding pad includes a recess formed at a position adjacent to the electrode separation gap so as to be sufficiently spaced apart from one area of the electrode separation gap.

According to one embodiment, the one area of the electrode separation gap may be an intersection where two linear portions cross each other.

According to one embodiment, the submount is in the form of a large quadrangle with four corners, the electrode separation gap is in the form of a straight line that is parallel to one side of the submount as a whole, the first reflective electrode film and the second reflective electrode film are in the form of quadrangles and are spaced apart from each other by the electrode separation gap, the first flip-chip bonding pad and the second flip-chip bonding pad are arranged in the central area of the heat dissipating substrate, and the first wire bonding pad and the second wire bonding pad are arranged at two diagonally facing corners of the submount.

According to one embodiment, the first flip-chip bonding pad consists of a plurality of bonding patterns and the second flip-chip bonding pad consists of one bonding pattern.

The package body is adapted to the characteristics of the UV LED chip and the submount includes a structure adapted to release heat generated when the UV LED chip emits UV light in cooperation with the package body. Due to this construction, the UV LED package of the present invention has the advantages of markedly improved heat dissipation performance, high efficiency, and good durability.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

An ultra-violet (UV) light emitting diode (LED) package according to a preferred embodiment of the present invention will now be described with reference to the accompanying drawings.

Figure 1:
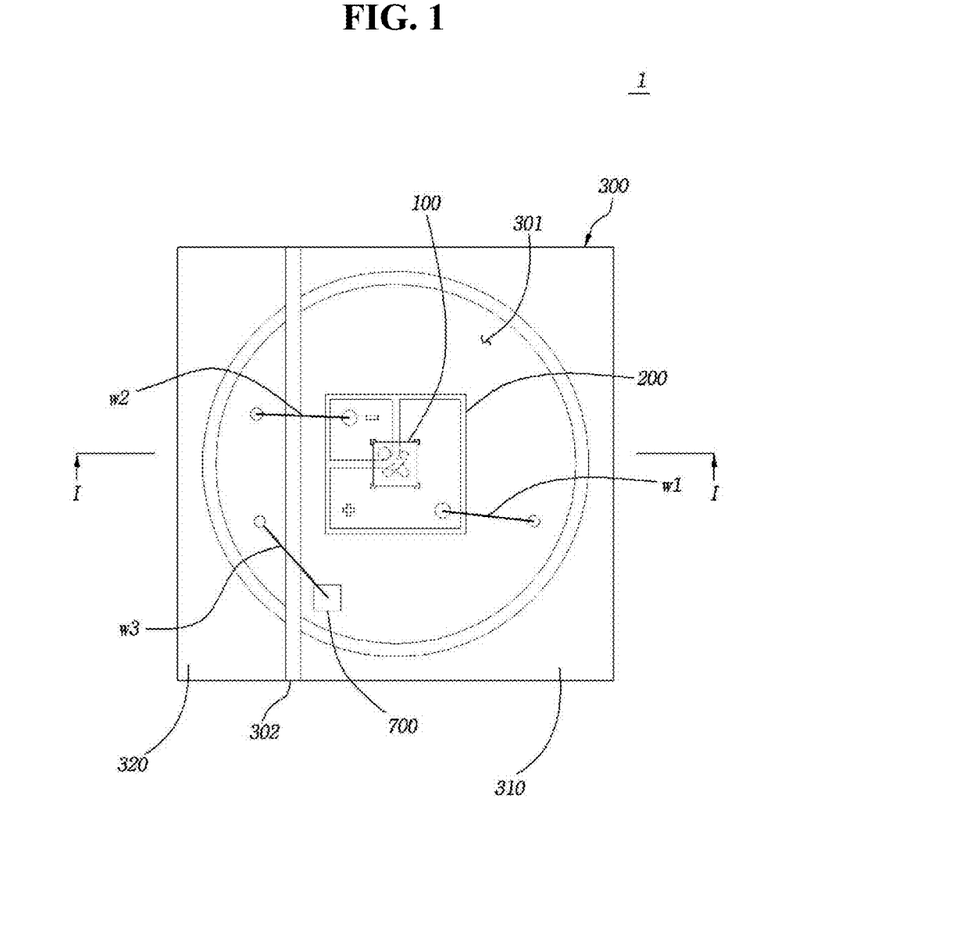
FIG. 1 is a plan view illustrating a UV LED package according to one embodiment of the present invention.
Figure 2:
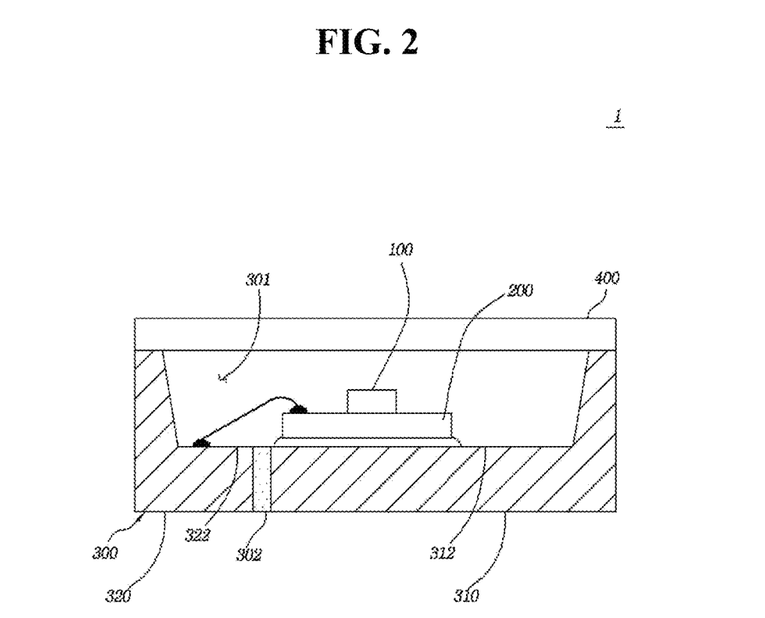
FIG. 2 is a cross-sectional view taken along line I-I of FIG. 1.
Figure 3:
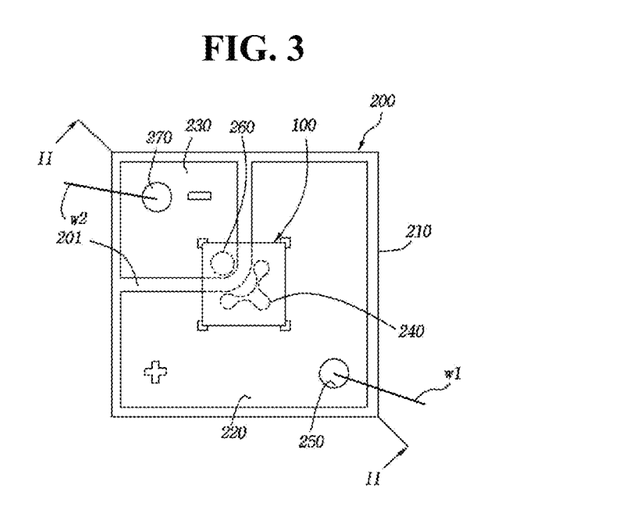
FIG. 3 is a plan view illustrating a submount mounted with a UV LED chip that covers flip-chip bonding pads indicated by hidden lines.
Figure 4:
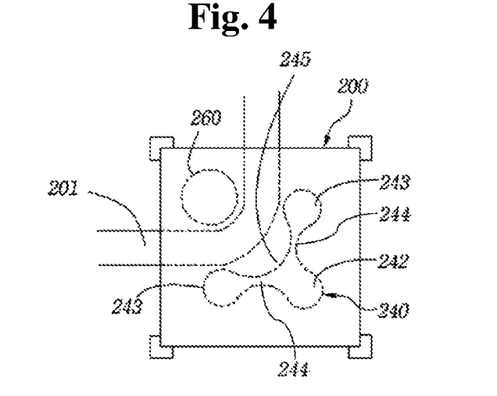
FIG. 4 is a partially enlarged plan view of FIG. 3.
Figure 5:
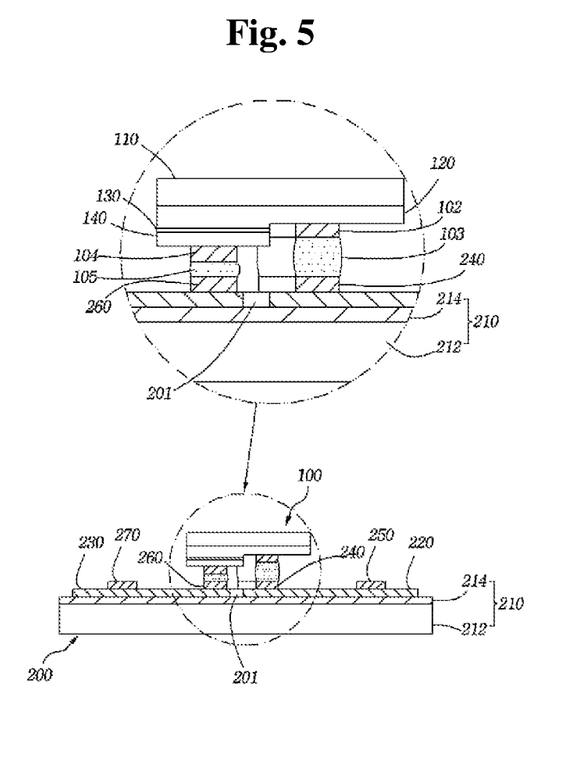
FIG. 5 is a cross-sectional view taken along line II-II of FIG. 3.

FIG. 1 is a plan view illustrating a UV LED package according to one embodiment of the present invention, FIG. 2 is a cross-sectional view taken along line I-I of FIG. 1, FIG. 3 is a plan view illustrating a submount mounted with a UV LED chip that covers flip-chip bonding pads indicated by hidden lines, FIG. 4 is a partially enlarged plan view of FIG. 3, and FIG. 5 is a cross-sectional view taken along line II-II of FIG. 3.

As illustrated in FIGS. 1 and 2, the UV LED package 1 includes a UV light emitting flip-chip UV LED chip 100, a submount 200 flip-chip bonded with the UV LED chip 100, a cup-shaped package body 300 mounted with the submount 200, and a UV transmissive protective member 400 coupled to the top portion of the cup-shaped package body 300 to protect the UV LED chip 100.

The cup-shaped package body 300 includes a cavity 301 in which the submount 200 flip-chip bonded with the UV LED chip 100 is accommodated. The submount 200 accommodated in the cavity 301 is mounted on the bottom of the cavity 301. The cup-shaped package body 300 includes a first metal body 310 and a second metal body 320 coupled to each other through an insulating material 302 interposed therebetween. The first metal body 310 and the second metal body 320 have a first depression and a second depression formed by a reduction in thickness at positions facing each other through the insulating material 302, respectively. The first depression 312 is merged with the second depression 322 to form the cavity 301. The first metal body 310 and the second metal body 320 are made of highly thermally conductive and reflective Al or its alloy.

The first metal body 310 and the second metal body 320 are electrically connected to the UV LED chip 100 and act as lead electrodes. The submount 200 is mounted only in the first depression 312 of the first metal body 310 on the bottom of the cavity 301. With this arrangement, the first metal body 310 acts as a heat dissipating block or a heat sink.

The cup-shaped package body 300 supplies an electric current to the UV LED chip 100 through the first metal body 310 and the second metal body 320 and acts as a heat sink to dissipate heat to the outside through the first metal body 310. The package body 300 has a truncated conical shape that is gradually widened upwardly. As mentioned above, the first metal body 310 and the second metal body 320 is made of a reflective metal, more specifically an Al material.

The shape of the package body and reflectivity of the metal bodies allow the package body to efficiently reflect and send out UV light.

Referring to FIGS. 3 to 5, the submount 200 includes a heat dissipating substrate 210 and a first reflective electrode film 220 and a second reflective electrode film 230 separated from each other by an electrode separation gap 201 on the heat dissipating substrate 210. A first flip-chip bonding pad 240 and a first wire bonding pad 250 are disposed on the first reflective electrode film 220 and a second flip-chip bonding pad 260 and a second wire bonding pad 270 are disposed on the second reflective electrode film 230. The first flip-chip bonding pad 240, the first wire bonding pad 250, the second flip-chip bonding pad 260, and the second wire bonding pad 270 are formed by the same process using the same material.

The heat dissipating substrate 210 may be prepared by oxidizing a highly pure and doped conductive Si wafer to form a $SiO_2$ layer acting as an insulating layer on the Si wafer. The first reflective electrode film 220 and the second reflective electrode film 230 may be formed by depositing an Al or Au metal material on the $SiO_2$ layer 214. For higher UV light reflectance, it is preferred that the first reflective electrode film 220 and the second reflective electrode film 230 are formed by Al deposition. Alternatively, the first reflective electrode film 220 and the second reflective electrode film 230 may be formed by Au deposition, which is advantageous for better corrosion resistance and reliability.

The first flip-chip bonding pad 240 and the first wire bonding pad 250 may be formed by depositing Au or AuSn on the first reflective electrode film 220. The second flip-chip bonding pad 260 and the second wire bonding pad 270 may be formed by depositing Au or AuSn on the second reflective electrode film 230.

The small UV LED chip 100 is mounted on the large-area submount 200 by flip-chip bonding rather than directly mounted on the lead electrode of the package body, and the submount 200 is then mounted on the first metal body 310 (see FIGS. 1 and 2) of the cup-shaped package body 300 (see FIGS. 1 and 2). With this arrangement, heat can be dissipated over a large area and released to the outside through the first metal body 310 (see FIGS. 1 and 2).

In this embodiment, the submount 200 is in the form of a large quadrangle with four corners, the second reflective electrode film 230 has a small quadrangular second area that occupies one of the four corners of the submount, and the first reflective electrode film 220 has a first area that surrounds two sides of the second area while occupying the three remaining corners. The electrode separation gap 201 by which the first reflective electrode film 220 is separated from the second reflective electrode film 230 is formed in a "⌐" shape. The shape of the electrode separation gap 201 enables a diagonal arrangement of the first flip-chip bonding pad 240 and the second flip-chip bonding pad 260. This arrangement greatly contributes to an increase in heat dissipation performance of the UV LED package as well as to a uniform diffusion of current into the UV LED chip 100.

Alternatively, the electrode separation gap 201 may be in the shape of a circular arc, a curve or a combination of two or more straight or curved lines crossing each other such that the relatively wide first reflective electrode film 220 surrounds a portion of the second reflective electrode film 230.

The second flip-chip bonding pad 260 is disposed adjacent to one corner of the second reflective electrode film 230 located in the central area of the submount 200. More specifically, the second flip-chip bonding pad 260 is located in the central area of the submount 200 on an imaginary diagonal line connecting the two diagonally facing corners of the submount 200. The first flip-chip bonding pad 240 is arranged adjacent to a recessed corner of the first reflective electrode film 220 diagonally facing the second flip-chip bonding pad 260.

The first flip-chip bonding pad 240 includes a main bonding pattern 242 diagonally facing the second flip-chip bonding pad 260 and a pair of peripheral bonding patterns 243 arranged away from the direction diagonal to the second flip-chip bonding pad 260 around the main bonding pattern 242. The main bonding pattern 242 is connected to the pair of peripheral bonding patterns 243 through a pair of linear connection bonding patterns 244 crossing each other at substantially right angles around the main bonding pattern 242. This connection enables the formation of the first flip-chip bonding pad 240 in a substantially "⌐" shape.

The first flip-chip bonding pad 240 is disposed in a "⌐" shape on the first reflective electrode film 220 outside the ⌐-shaped electrode separation gap 201 and the second flip-chip bonding pad 260 is disposed in a substantially circular shape on the second reflective electrode film 230 inside the ⌐-shaped electrode separation gap 201. The shapes and arrangements of the first flip-chip bonding pad 240 and the second flip-chip bonding pad 260 help improve the diffusion of current into the UV LED chip 100 and the heat dissipation performance of the UV LED package. The flip-chip bonding pad 240 together with bumps supports the UV LED chip 100. The arrangement and shape of the flip-chip bonding pad 240 allow for a more stable and reliable support of the UV LED chip 100 on the submount 200. As mentioned earlier, the electrode separation gap 201 includes an intersection where two linear portions cross each other in a "⌐" configuration. The first flip-chip bonding pad 240 includes a recess 245 by which it is sufficiently spaced from the intersection of the electrode separation gap 201. The recess 245 is formed in a direction where the first flip-chip bonding pad 240 faces the second flip-chip bonding pad 260. The main bonding pattern 242 may be spaced apart from the electrode separation gap 201 through the recess 245 in a direction away from the electrode separation gap 201.

Referring to FIGS. 1, 3, and 5, the UV LED chip 100 includes a first conductive electrode pad 102 whose shape and arrangement correspond to those of the first flip-chip bonding pad 240 and a second conductive electrode pad 104 whose shape and arrangement correspond to those of the second flip-chip bonding pad 260. The first conductive electrode pad 102 is bonded to the first flip-chip bonding pad 240 through a first bonding bump 103 and the second conductive electrode pad 104 is bonded to the second flip-chip bonding pad 260 through a second bonding bump 105.

The first wire bonding pad 250 is disposed on the first reflective electrode film 220 and the second wire bonding pad 270 is disposed on the second reflective electrode film 230. The first wire bonding pad 250 and the second wire bonding pad 270 are disposed at two diagonal corners of the submount 200. The first wire bonding pad 250, the second wire bonding pad 270, the first flip-chip bonding pad 240, and the second flip-chip bonding pad 260 are arranged on one diagonal line connecting the diagonal corners. A first bonding wire w1 electrically connects the first wire bonding pad 250 to the first metal body 310 and a second bonding wire w2 electrically connects the second wire bonding pad 270 to the second metal body 320. The above-described arrangement of the pads 240, 250, 260, and 270 minimizes the formation of defects during processing and the possibility of short-circuiting during use and enables a uniform diffusion of current into the UV LED chip 100. A zener diode 700 is mounted on and electrically connected to the first metal body 310. A third bonding wire w3 electrically connects the zener diode 700 to the second metal body 320.

As illustrated in FIG. 5, the UV LED chip 100 includes a light-transmitting substrate 110, a first conductive semiconductor layer 120, an active layer 130, and a second conductive semiconductor layer 140 formed in this order from the top to the bottom. The first conductive electrode pad 102 is disposed on one area of the first conductive semiconductor layer 120 opened by mesa etching. The second conductive electrode pad 104 is disposed on one area of the second conductive semiconductor layer 140 that is stepped with the first conductive semiconductor layer 120 and further extends downwardly. As mentioned previously, the first conductive electrode pad 102 has a shape corresponding to the first flip-chip bonding pad 240 and is bonded to the first flip-chip bonding pad 240 through the first bonding bump 103 and the second conductive electrode pad 104 has a shape corresponding to the second flip-chip bonding pad 260 and is bonded to the second flip-chip bonding pad 260 through the second bonding bump 105. It is preferred that the arrangements and shapes of the first conductive electrode pad 102 and the second conductive electrode pad 104 correspond to those of the first flip-chip bonding pad 240 and the second flip-chip bonding pad 260. SAC solders and fluxes are suitable as materials for the first and second bonding bumps.

More specifically, the first and second flip-chip bonding pads 240 and 260 and their corresponding first and second conductive electrode pads 102 and 104 are made of a material (particularly, Au or AuSn) miscible with a soldering material for the bonding bumps. The material for the first and second bonding bumps 103 and 105 is determined depending on the material for the first and second flip-chip bonding pads 240 and 260 and their corresponding first and second conductive electrode pads 102 and 104.

The first and second flip-chip bonding pads 240 and 260 and the first and second conductive electrode pads 102 and 104 may be made of Au. In this case, a SAC solder for solder bonding is selected as a material for the first and second bonding bumps 103 and 105. Alternatively, the first and second flip-chip bonding pads 240 and 260 and the first and second conductive electrode pads 102 and 104 may be made of AuSn. In this case, a flux for eutectic bonding is used as a material for the first and second bonding bumps 103 and 105.

The reason for selection of the materials is that if the material for the flip-chip bonding pads of the submount is not compatible with the material for the bonding bumps, effective bonding is not obtained and deterioration of heat dissipation performance is caused.

The first and second bonding wires w1 and w2 are Au wires, which is advantageous for low resistance and reliable electrical connection. Preferably, the Au wires have a purity of 99.99% or higher. The same material (i.e. Au) for the first wire bonding pad 250 and the second wire bonding pad 270 is preferably used for the first and second bonding wires w1 and w2. If the first wire bonding pad 250 and the second wire bonding pad 270 are made of a material different from the material of the first and second bonding wires w1 and w2, sufficient bonding strength is not obtained and low reliability is caused.

In the case where the wire bonding pads are made of the same material (i.e. Au) as the flip-chip bonding pads, the bonding pads can also be formed by the same process.

The light-transmitting substrate 110 of the UV LED chip 100 is preferably a sapphire substrate that is suitable for the growth of epilayers, including the first conductive semiconductor layer 120 based on gallium nitride, the active layer 130, and the second conductive semiconductor layer 140. When the first conductive semiconductor layer 120 is an n-type semiconductor layer, the second conductive semiconductor layer 140 is a p-type semiconductor layer, and vice versa. The active layer 130 may include a multi-quantum well structure.

Referring to FIG. 1, the UV transmissive protective member 400 is made of quartz through which UV light in the UV-C wavelength region can be transmitted. The UV transmissive protective member 400 made of quartz is attached to the top portion of the cup-shaped package body 300 by a silicone-based adhesive to cover the cavity 301 formed in the UV LED chip 100. Considering that UV light causes resins to crack, the first and second metal bodies 310 and 320 constitute a large portion of the cup-shaped package body 300 and the UV transmissive protective member 400 covering the cavity 301 is made of quartz to avoid problems (e.g., cracking or denaturation) caused by UV light.

Figure 6:
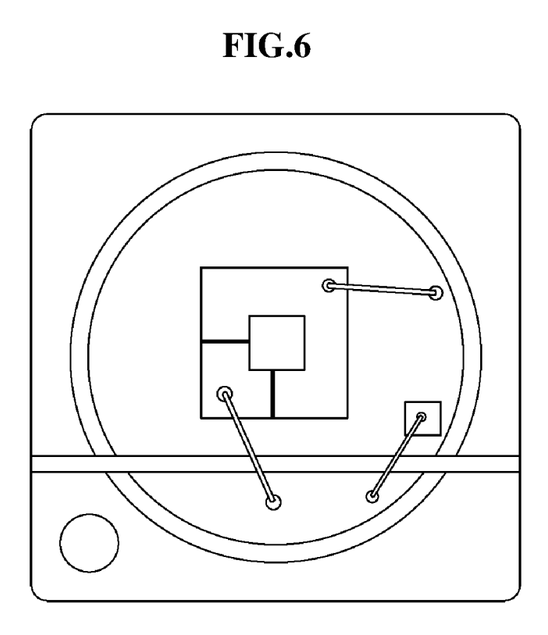
FIG. 6 is an actual image showing a UV LED package according to one embodiment of the present invention.

FIG. 6 is an actual image of the UV LED package. Referring to FIG. 6, the submount is mounted on the relatively large metal body of the cup-shaped package body and the UV LED chip is mounted on the submount.

Figure 7:
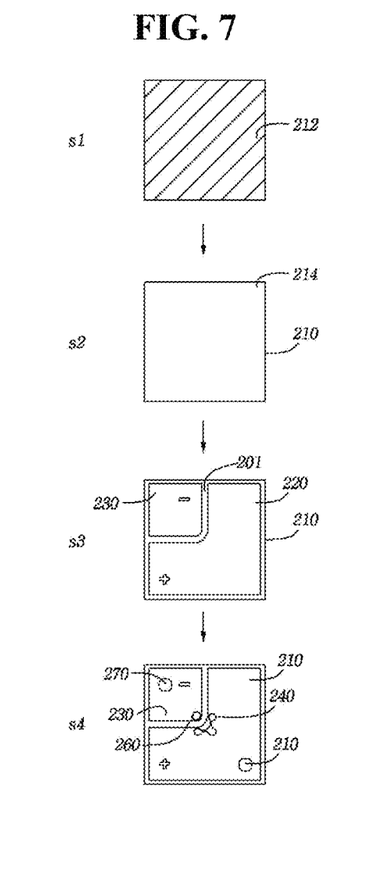
FIG. 7 illustrates cross-sectional views for explaining a method for producing a submount of a UV LED package according to one embodiment of the present invention.

FIG. 7 illustrates cross-sectional views for explaining a procedure for producing a submount of a UV LED package according to one embodiment of the present invention.

Referring to FIG. 7, a quadrangular conductive Si substrate 212 with good heat dissipation performance is prepared (first step s1). Subsequently, a SiO2 insulating layer 214 is formed over the entire upper surface of the conductive Si substrate 212 by oxidizing the upper surface of the conductive Si substrate 212 (second step s2). As a result of the first and second steps s1 and s2, a quadrangular heat dissipating substrate 210 including the conductive Si substrate 212 and the SiO2 layer 214 is formed. In a subsequent third step s3, a first reflective electrode film 220 having a larger area and a second reflective electrode film 230 having a smaller area are formed on the heat dissipating substrate 210. The first reflective electrode film 220 occupies three of the four corners of the heat dissipating substrate 210 and the second reflective electrode film 230 occupies the one remaining corner of the heat dissipating substrate 210. The first reflective electrode film 220 and the second reflective electrode film 230 are separated from each other by an electrode separation gap 201 and are made of Al or Au. Specifically, the reflective electrode films can be formed by depositing Al or Au over the entire upper surface of the heat dissipating substrate 210 and etching off an area including the electrode separation gap 201. Alternatively, the reflective electrode films may be formed by depositing Al or Au through a mask on the upper surface of the heat dissipating substrate 210 other than an area including the electrode separation gap 201. In a subsequent fourth step s4, a first flip-chip bonding pad 240 and a first wire bonding pad 250 are formed on the first reflective electrode film 220 and a second flip-chip bonding pad 260 and a second wire bonding pad 270 are formed on the second reflective electrode film 230. The bonding pads 240, 250, 260, and 270 may be formed by depositing a metal, such as Au or AuSn, followed by etching. Alternatively, the 15 bonding pads may be formed by depositing or coating a metal, such as Au or AuSn, through a mask only on corresponding areas.

As mentioned previously, the second flip-chip bonding pad 260 is disposed at one of the four corners of the second reflective electrode film 230 located in the central area of the heat dissipating substrate 210 or the submount including the heat dissipating substrate. Specifically, the second flip-chip bonding pad 260 is located in the central area of the submount on an imaginary diagonal line connecting the two diagonally facing corners of the submount.

Figure 8:
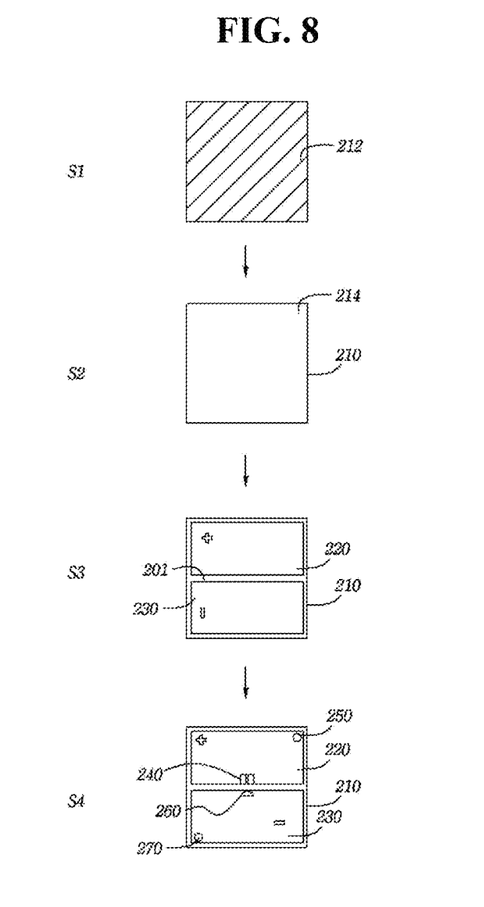
FIG. 8 illustrates cross-sectional views for explaining a method for producing a submount of a UV LED package according to a further embodiment of the present invention.

FIG. 8 illustrates cross-sectional views for explaining a procedure for producing a submount of a UV LED package according to a further embodiment of the present invention.

Referring to FIG. 8, a quadrangular conductive Si substrate 212 with good heat dissipation performance is prepared (first step S1). Subsequently, a SiO$_2$ insulating layer 214 is formed over the entire upper surface of the conductive Si substrate 212 by oxidizing the upper surface of the conductive Si substrate 212 (second step S2). In a subsequent third step S3, a first reflective electrode film 220 and a second reflective electrode film 240 in the form of quadrangles are formed on the heat dissipating substrate 210. The first reflective electrode film 220 is separated from the second reflective electrode film 240 by an electrode separation gap that is parallel to one side of the heat dissipating substrate 210 as a whole. In a subsequent fourth step S4, a first flip-chip bonding pad 240 and a first wire bonding pad 250 are formed on the first reflective electrode film 220 and a second flip-chip bonding pad 260 and a second wire bonding pad 270 are formed on the second reflective electrode film 230. The bonding pads 240, 250, 260, and 270 may be formed by depositing a metal, such as Au or AuSn, followed by etching. Alternatively, the bonding pads may be formed by depositing a metal, such as Au or AuSn, through a mask only on corresponding areas. The first flip-chip bonding pad 240 and the second flip-chip bonding pad 260 are arranged in the central area of the heat dissipating substrate 210. The first wire bonding pad 250 and the second wire bonding pad 270 are arranged at two diagonally facing corners of the heat dissipating substrate 210. The first flip-chip bonding pad 240 includes a plurality of rectangular bonding patterns connected to a plurality of first conductive pads of a UV LED chip through bonding bumps. The second flip-chip bonding pad 260 includes one semicircular bonding pattern connected to one second conductive pad of the UV LED chip through a bonding bump. Au or AuSn may be used to form the bonding patterns.

What is claimed is:

1. An ultra-violet (UV) light emitting diode (LED) package comprising:
   a submount comprising a heat dissipating substrate, a first reflective electrode film and a second reflective electrode film separated from the first reflective electrode film by an electrode separation gap on the heat dissipating substrate, a first flip-chip bonding pad and a first wire bonding pad disposed on the first reflective electrode film, and a second flip-chip bonding pad and a second wire bonding pad disposed on the second reflective electrode film;
   a UV LED chip adapted to emit UV light at 200 nm to 400 nm, the UV LED chip comprising a first conductive electrode pad corresponding to the first flip-chip bonding pad and a second conductive electrode pad corresponding to the second flip-chip bonding pad, and flip-chip bonded to the submount through a first bonding bump disposed between the first flip-chip bonding pad and the first conductive electrode pad and a second bonding bump disposed between the second flip-chip bonding pad and the second conductive electrode pad; and
   a package body mounted on the submount and comprising a first metal body electrically connected to the first wire bonding pad through a first bonding wire and a second metal body separated from the first metal body by an insulating material and electrically connected to the second wire bonding pad through a second bonding wire,
   wherein the first flip-chip bonding pad comprises a recess formed at a position adjacent to the electrode separation gap so as to be sufficiently spaced apart from one area of the electrode separation gap.

2. The UV LED package according to claim 1, wherein the first metal body and the second metal body have a first depression and a second depression formed by a reduction in thickness at positions facing each other through the insulating material, respectively, and the first depression is merged with the second depression to form a cavity in which the UV LED chip and the submount are accommodated.

3. The UV LED package according to claim 2, wherein the first metal body and the second metal body are made of an Al material.

4. The UV LED package according to claim 1, further comprising a UV transmissive protective member made of quartz that is coupled to a top portion of the package body to protect the UV LED chip.

5. The UV LED package according to claim 1, wherein the heat dissipating substrate comprises a conductive Si wafer and a SiO2 layer formed on the conductive Si wafer by oxidizing the conductive Si wafer.

6. The UV LED package according to claim 1, wherein the first reflective electrode film and the second reflective electrode film are formed by depositing Al or Au on the heat dissipating substrate.

7. The UV LED package according to claim 1, wherein the first flip-chip bonding pad and the first wire bonding pad are formed on the first reflective electrode film and the second flip-chip bonding pad and the second wire bonding pad are formed on the second reflective electrode film using a material comprising Au or AuSn.

8. The UV LED package according to claim 1, wherein the submount is mounted only on the first metal body.

9. The UV LED package according to claim 8, wherein the first metal body has a larger area than the second metal body.

10. The UV LED package according to claim 1, wherein the electrode separation gap is in a shape of a circular arc, a curve or a combination of two or more straight or curved lines crossing each other such that the first reflective electrode film surrounds a portion of the second reflective electrode film.

11. The UV LED package according to claim 1, wherein the submount is in the form of a large quadrangle with four corners, the second reflective electrode film has a small quadrangular second area that occupies one of four corners of the submount, and the first reflective electrode film has a first area that surrounds two sides of the second area while occupying the three remaining corners.

12. The UV LED package according to claim 11, wherein the second flip-chip bonding pad is disposed adjacent to one corner of the second reflective electrode film located in a central area of the submount and the first flip-chip bonding pad is arranged adjacent to a recessed corner of the first reflective electrode film diagonally facing the second flip-chip bonding pad.

13. The UV LED package according to claim 12, wherein the first flip-chip bonding pad comprises a main bonding pattern diagonally facing the second flip-chip bonding pad and a pair of peripheral bonding patterns arranged away from a direction diagonal to the second flip-chip bonding pad around the main bonding pattern.

14. The UV LED package according to claim 1, wherein the electrode separation gap is formed in an L-shape, the first flip-chip bonding pad is disposed in an L-shape on the first reflective electrode film outside the L-shaped electrode separation gap, and the second flip-chip bonding pad is disposed in a circular shape on the second reflective electrode film inside the L-shaped electrode separation gap.

15. The UV LED package according to claim 1, wherein the one area of the electrode separation gap is an intersection where two linear portions cross each other.

16. The UV LED package according to claim 1, wherein the submount is in the form of a large quadrangle with four corners, the electrode separation gap is in the form of a straight line that is parallel to one side of the submount as a whole, the first reflective electrode film and the second reflective electrode film are in the form of quadrangles and are spaced apart from each other by the electrode separation gap, the first flip-chip bonding pad and the second flip-chip bonding pad are arranged in a central area of the heat dissipating substrate, and the first wire bonding pad and the second wire bonding pad are arranged at two diagonally facing corners of the submount.

17. The UV LED package according to claim 16, wherein the first flip-chip bonding pad consists of a plurality of bonding patterns and the second flip-chip bonding pad consists of one bonding pattern.

18. An ultra-violet (UV) light emitting diode (LED) package comprising:
a submount comprising a heat dissipating substrate, a first reflective electrode film and a second reflective electrode film separated from the first reflective electrode film by an electrode separation gap on the heat dissipating substrate, a first flip-chip bonding pad and a first wire bonding pad disposed on the first reflective electrode film, and a second flip-chip bonding pad and a second wire bonding pad disposed on the second reflective electrode film;
a UV LED chip adapted to emit UV light at 200 nm to 400 nm, the UV LED chip being comprising a first conductive electrode pad corresponding to the first flip-chip bonding pad and a second conductive electrode pad corresponding to the second flip-chip bonding pad, and flip-chip bonded to the submount through a first bonding bump disposed between the first flip-chip bonding pad and the first conductive electrode pad and a second bonding bump disposed between the second flip-chip bonding pad and the second conductive electrode pad; and
a package body mounted on the submount and comprising a first metal body electrically connected to the first wire bonding pad through a first bonding wire and a second metal body separated from the first metal body by an insulating material and electrically connected to the second wire bonding pad through a second bonding wire,
wherein the submount is in the form of a large quadrangle with four corners, the second reflective electrode film has a small quadrangular second area that occupies one of four corners of the submount, and the first reflective electrode film has a first area that surrounds two sides of the second area while occupying the three remaining corners,
wherein the second flip-chip bonding pad is disposed adjacent to one corner of the second reflective electrode film located in a central area of the submount and the first flip-chip bonding pad is arranged adjacent to a recessed corner of the first reflective electrode film diagonally facing the second flip-chip bonding pad,
wherein the first flip-chip bonding pad comprises a main bonding pattern diagonally facing the second flip-chip bonding pad and a pair of peripheral bonding patterns arranged away from a direction diagonal to the second flip-chip bonding pad around the main bonding pattern, and
wherein the main bonding pattern is connected to the pair of peripheral bonding patterns through a pair of linear connection bonding patterns crossing each other around the main bonding pattern.

* * * * *